June 20, 1967 J. E. ENGELKING 3,325,881

ELECTRICAL CIRCUIT BOARD FABRICATION

Filed Jan. 8, 1963 2 Sheets-Sheet 1

INVENTOR
JAMES E. ENGELKING
BY Herbert Bonnemayer
ATTORNEY

June 20, 1967 J. E. ENGELKING 3,325,881

ELECTRICAL CIRCUIT BOARD FABRICATION

Filed Jan. 8, 1963 2 Sheets-Sheet 2

INVENTOR
JAMES E. ENGELKING
BY
ATTORNEY

United States Patent Office 3,325,881
Patented June 20, 1967

3,325,881
ELECTRICAL CIRCUIT BOARD FABRICATION
James E. Engelking, St. Paul, Minn., assignor to Sperry Rand Corporation, New York, N.Y., a corporation of Delaware
Filed Jan. 8, 1963, Ser. No. 250,162
7 Claims. (Cl. 29—155.5)

This invention relates generally to printed circuits having apertures therein, and more specifically to a method for forming the apertures in the insulating support portion of the printed circuit and providing the apertures with electrically conductive linings.

In the fabrication of printed circuits, it is sometimes advantageous to form electrical conductors on the opposite major surfaces of the insulating support member, and to make provisions for electrically connecting certain selected conductors disposed on one surface of the support member to certain selected conductors on the opposite surface. In the past, electrical interconnections of this type have been accomplished by forming apertures through the support member and providing the apertures with an electrically conductive lining in the form of rivets, sleeves, or metallic coatings. The interconnection of selected conductors is accomplished by connecting the conductors to a common aperture lining. Recently, apertures formed in printed circuits have also been utilized to facilitate electrical interconnection of conductors on two or more printed circuits. In one technique for electrically interconnecting circuitry on individual printed circuits, the circuit cards are each provided with a predetermined pattern of plated-through holes and assembled in superimposed or stacked relation in registration with one another. Since the cards are in registration, corresponding plated-through holes in adjacent circuit cards are aligned and effectively form a socket. An interconnecting member which may be in the form of a resilient tubular member or tine is then inserted into each series of aligned apertures, the tubular member frictionally engaging the conductive aperture linings to make electrical contact therewith. Card circuitry on different levels is electrically connected by way of the aperture linings and the interconnecting member.

In either of the above discussed uses for apertures in printed circiut cards it has been found very costly to use rivets or metallic sleeves to form the requisite conductive aperture lining when the apertures are relatively small and spaced closely together. Accordingly, in many instances conductive aperture linings are formed by depositing an electrically conductive coating on the aperture wall. Most commonly this is accomplished by initially chemically depositing a metallic layer on the aperture wall and thereafter increasing the thickness of the layer by electroplating. This method of forming aperture linings is commonly referred to as a "plated-through" hole process. As is well known in the art, when it is desired to fabricate a "plated-through" hole it is important that the finish on the aperture wall be such as to permit the forming of a good mechanical bond between the wall and the initially deposited metallic layer. Oftentimes when the aperture is formed by drilling or punching, the aperture wall is not smoothly formed and burr-like pieces are exposed along the inner wall of the support member. Any metallic coating formed over these pieces usually adheres poorly to the aperture wall and the bond is accordingly easily ruptured upon the insertion of an interconnecting member. An additional objection to the "plated-through" hole process pertains to the difficulty of forming a uniform thickness of coating within the aperture. Generally the thickness of the electrodeposited aperture lining or coating decreases toward the axial midpoint of the aperture and thus the lined aperture may exhibit a varying diameter. This varying aperture diameter is apparently caused during the electroplating step and occurs even though the aperture walls possess the desired finish before electroplating. When using the type of interconnecting member mentioned above with a circuit assembly wherein the circuit cards are stacked in very close relation, aperture diameters are critical. If the diameter of one aperture in an aligned series of apertures is somewhat smaller than the next, the resilient interconnecting member after passing through such as aperture is normally unable to expand a sufficient amount to make reliable electrical contact with the conductive linings of a subsequent aperture. In the light of such limitation, it becomes necessary to exercise vigilant control during the forming of the aperture linings and to provide a rigid inspection operation after the linings are formed, which operations substantially increase the cost of fabricating such printed circuits.

The present invention overcomes the aforementioned objections to the prior art methods by providing a method for forming a printed circuit insulating support member having apertures which are formed in a manner that permits the finish of the aperture wall to be controlled. Further, the method of the present invention also permits the forming of printed circuit support members having electrically conductive linings in the apertures, these lined apertures having a substantially uniform inside diameter throughout. This is accomplished in accordance with the method of the present invention which includes the steps of initially forming a plurality of holding members having apertures therein, the apertures being disposed in accordance with a predetermined pattern, arranging the members in registration in substantially parallel spaced-apart relationship such that the apertures are axially aligned, threading or piercing each aperture series with an elongated conductive member, casting a resin about and between the elongated members and after the resin has cured, separating the cast assembly into sections, and thereafter removing the portions of the elongated conductive member in each section, such as by etching or a similar process. Where it is desired that the aperture be formed with a conductive lining, the elongated members are coated with a metal, such as gold, prior to the casting step. The coating metal is one which is not soluble in the etchant employed to remove the portion of the elongated member in each section so that after the etching step is complete, the metal remains as an aperture lining.

It is, therefore, a primary object of the present invention to provide an improved method for forming an electrically insulating support member having apertures therein, the support member being of the type commonly employed in the fabrication of printed circuits.

It is also an object of the present invention to provide a method for forming insulating members having apertures therein, and wherein the apertures of each member are formed simultaneously.

It is also an object of the present invention to provide a method for forming insulating members having apertures therein, wherein the surface finish of the aperture walls may be predetermined.

It is a further object of the present invention to provide a method for forming multiapertured insulating members wherein predetermined apertures may be formed with conductive linings secured to the insulating member.

These and other more detailed and specific objectives will be disclosed in the course of the following specification, reference being made to the accompanying drawings, in which.

Figures 1, 2:
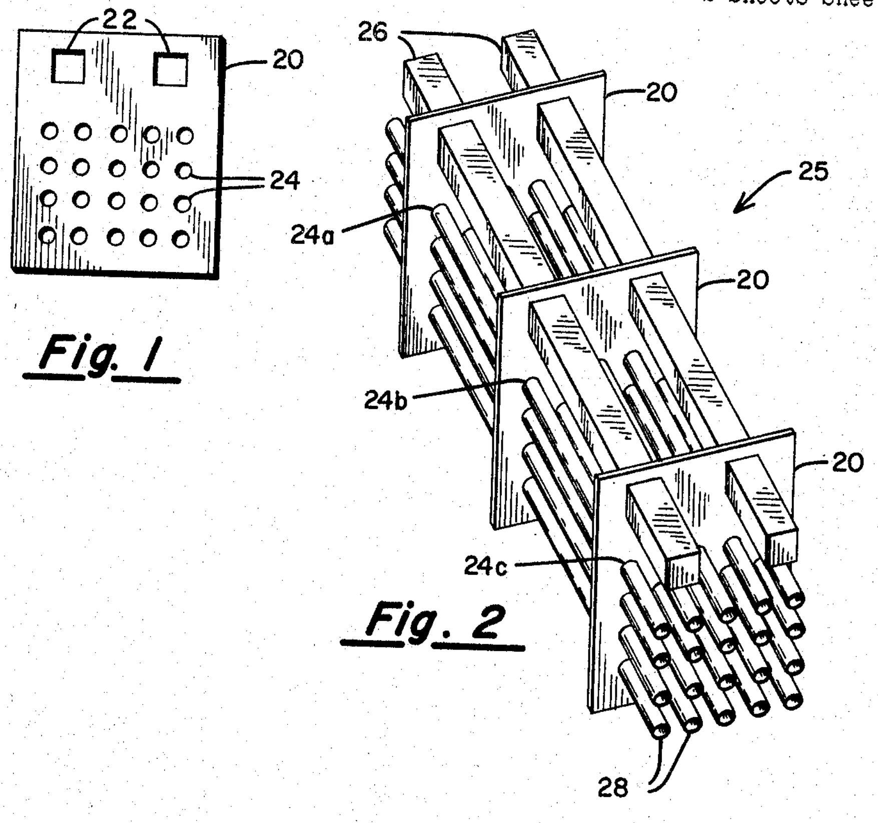
FIG. 1 is a front view of a holding member employed in the illustrated embodiment of the present invention.
FIG. 2 is a perspective view of a plurality of holding members threaded or pierced with a plurality of tubular members.

Referring now to the drawings, wherein like numerals designate similar components, and more particularly to FIG. 1, there is seen a multiapertured holding member 20 of the type employed in the preferred embodiment of the present invention. A pair of locating holes 22 and a plurality of apertures 24 which are arranged in accordance with a predetermined pattern are formed in the member 20. As illustrated, the apertures 24 are disposed in four rows, each row including five circular apertures. It is to be understood that the particular aperture pattern is merely exemplary and also that the apertures 24 need not be circular in form but may have any desired geometry.

The first step of the process of the present invention comprises the forming of the holding member 20. This member is preferably fabricated from a beryllium-copper alloy appropriately tempered to a predetermined degree of strength. It is not a requisite that the member 20 have any particular thickness although it is preferable that the thickness be such as to permit handling of the member with a relative degree of ease. A suitable thickness may, for example, be about 0.010 inch. The forming of the locating holes 22 and apertures 24 may be accomplished by conventional die stamping, but where the apertures are very small and spaced closely together, it is believed they are most accurately and economically formed by etching, which etching may be accomplished using well known photo-etching processes such as are commonly employed in the fabrication of printed circuit cards. Although a beryllium-copper has been found in the light of the many design factors considered, to be a particularly suitable alloy for forming the member 20, other alloys, such as Phosphor bronze, may also be used.

Referring now to FIG. 2, there is seen an assembly generally designated by the numeral 25 which includes a plurality of holding members 20 arranged in substantially parallel spaced-apart relation and threaded or pierced with a plurality of locating members 26 and elongated members 28. In the preferred embodiment of the present invention, the members 28 are tubular in form, although they may be formed from solid rod as well, and fabricated from a metal, such as stainless steel. In another aspect of the invention, the members 28 may be coated, as by electroplating or spraying, with a film of a metal, for a purpose to be discussed hereinafter. The members 28 may also be fabricated from other than metals, for example, glass or epoxy resins, which may be coated with a film or layer of a metallic substance. The next step involved in carrying out the present invention begins with arranging a plurality of holding members 20 in registration, such that the apertures of one member are substantially aligned with the corresponding apertures in any other holding member. By appropriately locating the holding members, a plurality of series of aligned apertures, such as the apertures **24*a*, 24*b* and 24*c*, is formed, each series including one aperture from each holding member. The holding members 20 are initially arranged in registration by threading or piercing the relatively locating holes 22 with locating members 26 which in the preferred embodiment are at least two in number, these members having a rectangular cross-section. Thereafter an elongated metallic member 28 is threaded through each series of aligned circular apertures. To facilitate the threading operation, the holding members may be initially disposed in close proximity to one another, and after a metallic member 28** has been disposed in each aperture series, the holding members are separated a predetermined distance.

Figure 3:
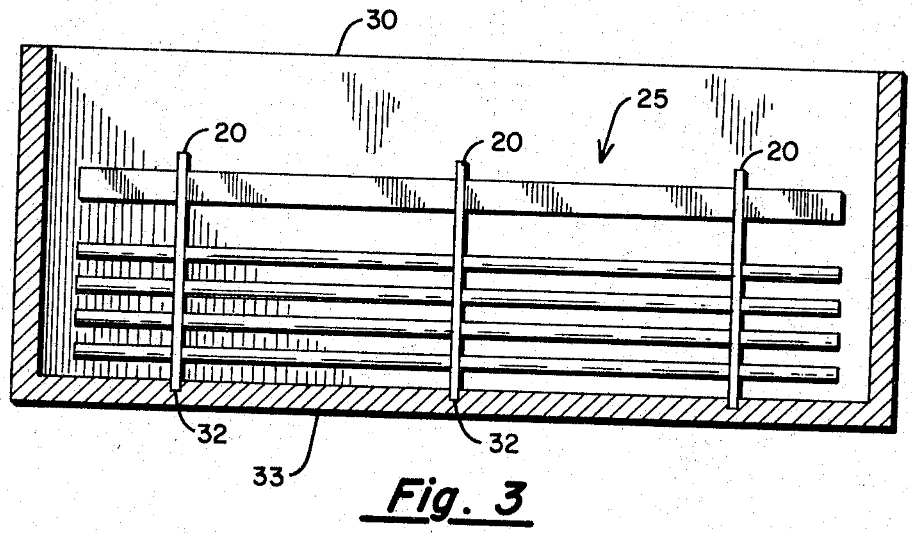
FIG. 3 is a cross-sectional side view of the assembly shown in FIG. 2 after the assembly has been mounted in an apparatus suitable for holding the assembly during a molding process.

Referring now to FIG. 3, there is seen a molding fixture 30 wherein there is disposed the assembly 25. Several slots 32 in the bottom wall 33 of the fixture each receive one edge of a holding member for maintaining the members 20 in spaced-apart relation during a molding operation which is the next step carried out in the practice of the present invention. After the fixture 30 has been coated with an appropriate mold-release material and the assembly 25 properly disposed therein, a molding compound is poured into the space about and between the members 28 and to the level of the locating members 26. The molding compound employed is preferably a liquid or semi-liquid at room temperature, although compounds that become liquid at elevated temperatures may also be employed. The molding compound or material selected, however, should exhibit low shrinkage characteristics and minimum stress formation. Further the material should be of the type which becomes solidified either by heating the same, or at room temperature, and which when solidified is an electrical insulator. One such material found satisfactory is identified by the code name Stycast 3070, a product of Emerson and Cummings, Inc., which material is a high temperature epoxy resin to which has been added a mineral-glass filler for reducing stress formation. The molding process of the present invention is preferably accomplished in an evacuated atmosphere, such as, may be provided by a vacuum oven, for avoiding the formation of voids in the hardened epoxy. After the resin has been cast into the molding fixture, the resin is cured, the curing being accomplished at a temperature and for a period of time as is proper for the resin selected.

Figures 4, 5:
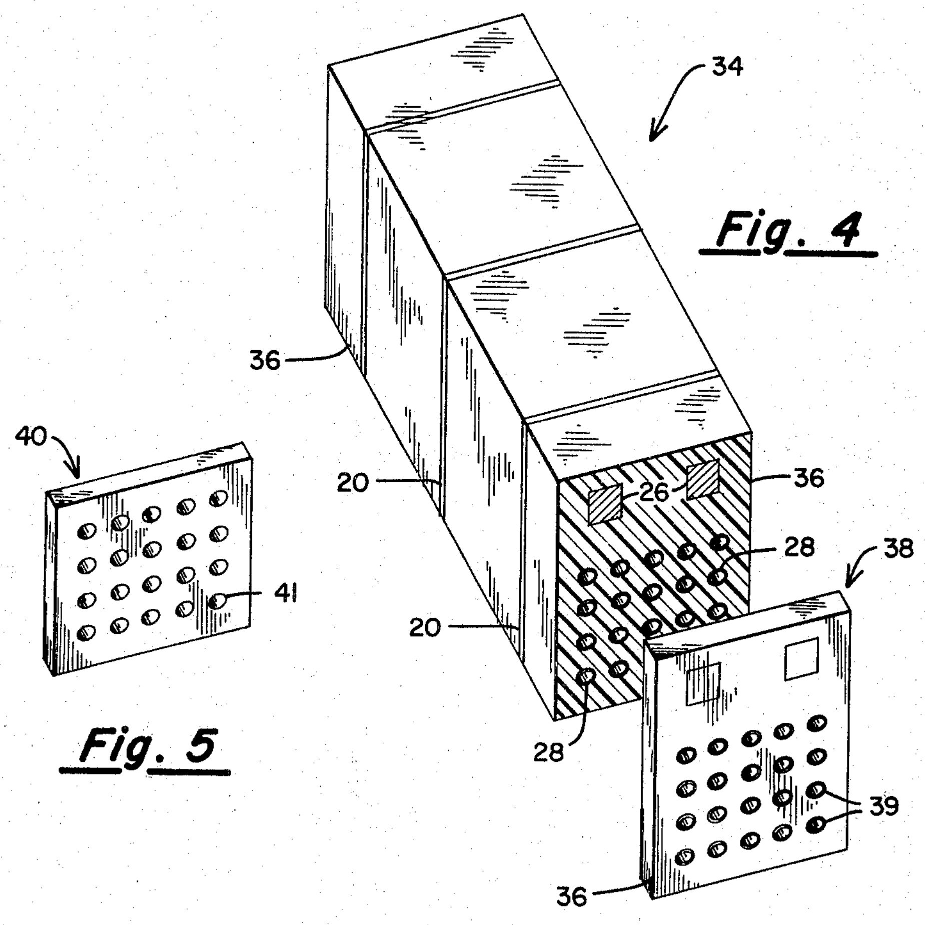
FIG. 4 is a perspective view of a cast assembly with a section thereof removed.
FIG. 5 is a front perspective view of an apertured support member fabricated in accordance with the present invention.

After the molding operation is complete, the resulting unit, designated generally at 34 as seen in FIG. 4, is treated in accordance with step 4 of the present invention. The unit 34, which includes the hardened resin 36, the locating members 26, the metallic members 28, and the holding members 20, is separated into several sections, such as the section 38. The separation, which may be accomplished by cutting with a fine-toothed saw or a diamond cutting tool such as is used in gem cutting, is accomplished in a plane substantially perpendicular to the longitudinal axes of the metallic members 28. That portion of each section 38 wherein the locating members 26 are disposed may be cut away before or after the unit 34 is separated into individual sections, and the remaining portion of the section 38 is then polished to the final desired dimensions.

Figure 6:
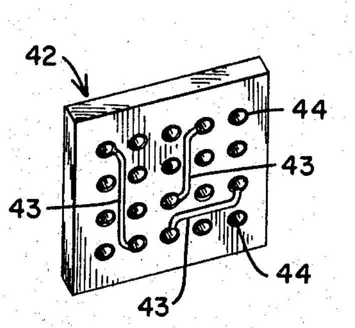
FIG. 6 is a perspective view of a printed circuit formed from a support member fabricated in accordance with the present invention.

After the separated sections 38 have been reduced to the desired dimensions, step 5 is initiated. This step involves the removal of those portions 39 of the metallic members 28 remaining in each individual section 38. In the preferred embodiment, this removal is accomplished by etching, the particular etchant selected being one that will remove the metallic portions 39 without deleteriously affecting the resin 36. Where the elongated members 28 are formed from stainless steel, the removal of the portions 39 may be accomplished with a suitable solution of ferric chloride, in the manner well known in the art. The product resulting from the foregoing process is seen in FIG. 5 which illustrates an electrically insulating member 40 having formed therethrough a predetermined pattern of accurately formed smooth-walled apertures 41. The member 40 may be employed to form the base of a printed circuit as seen in FIG. 6 at 42. The circuit card 42 may be formed by chemically depositing a layer of copper on the surface of the member 40 and within the apertures 41 on the walls thereof, increasing selectively removing, as by etching, undesirable portions of the copper. After etching, the copper remaining on the insulator surface forms the circuit conductors 43 and the copper deposited on the aperture walls forms aperture linings 44 which may serve to interconnect conductors disposed on opposite sides of the insulating member. As is well known in the art, when a process as above described is used to form a printed circuit, it is difficult to repeatedly form a good conductive coating or lining on the aperture walls. Effecting a reliable bond between the aperture wall and the coating depends a good deal on the finish of the aperture walls. Thus, where the aperture is formed by drilling or punching, it must be inspected or otherwise treated prior to coating to assure that no material burrs exist therein. The method of the present invention obviates this problem for the aperture wall takes the finish of the metallic member 28. Thus the condition of the aperture walls is predetermined and may be varied as desired by assigning a particular finish to the metallic members 28 employed.

Figure 7:
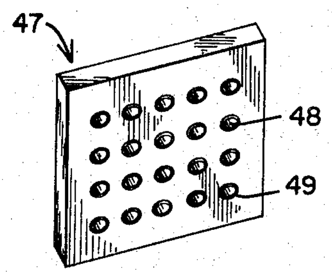
FIG. 7 is a perspective view of an apertured support member wherein the individual apertures have been formed with electrically conductive linings.

Referring now to FIG. 7, there is seen an insulating support member 47 fabricated in accord with another aspect of the present invention. The support member 47 is provided with a plurality of apertures 48 each having an electrically conductive lining 49. The provision of the lining 49 is accomplished by forming a coating on the members 26 prior to their insertion into the holding members. For example, the member may be formed from copper rod, and a coating, such as gold, be deposited thereon as by electroplating. When the etching step of the present invention is reached, the copper only is removed, the gold remaining as the aperture lining. For effecting a good mechanical bond between the gold and the insulating material, the gold surface may be roughed by vapor blasting, after being deposited on the rod member.

As was mentioned above, the rod member may be fabricated from glass rod or tubing. If such were the case the glass rod member would be coated with an etchable material, such as copper. If it is desired to avoid the etching step, the rod member may be coated with a material such as solder, and the rod member removed by causing the solder to melt. When it is intended to use heat for removing the rod member portions, the material selected to form the insulating portion of the support member should, of course, be capable of withstanding elevated temperatures. More particularly where a solder coated rod member is to be removed by heating, the insulating material should be such that it resists wetting by solder so that the solder, upon melting, will flow from the aperture leaving the aperture with a clean wall.

It is understood that suitable modifications may be made in the structure as disclosed and that such modifications will fall within the spirit and scope of the appended claims. Having now, therefore, fully illustrated and described our invention, what we claim to be new and desire to protect by Letters Patent is:

What is claimed is:

1. A method for forming a multiapertured electrically insulating support member of the type utilized in the fabrication of printed circuits wherein the apertures are provided with electrically conductive linings formed from a selected material, which method includes the steps of:

(a) applying a coating of an electrically conductive material to the individual ones of a plurality of elongated members, with the conductive material being different from the member material;

(b) securing the coated members in substantially parallel, spaced-apart, fixed relation by casting a resin about and between the members, the resin being cured for causing it to harden whereby the coated members and hardened resin form a unitary assembly;

(c) separating the assembly into sheet-like sections, the sections being formed by separating the assembly in a plane substantially perpendicular to the longitudinal axis of the members;

(d) and thereafter exposing the separated sections to the action of an etchant, in which the coating material is substantially insoluble, such that the portions of the members contained in each section are selectively etched away, the coating material being permitted to remain for forming the individual aperture linings.

2. A method as in claim 1 wherein the coating material is gold.

3. A method for forming an electrically insulating support member of the type utilized in the fabrication of printed circuits, which method includes the steps of:

(a) arranging a plurality of similarly apertured holding members in registered relation for forming a plurality of aligned series of apertures, each series including one aperture from each holding member;

(b) applying a coating of an electrically conductive material to the individual ones of a plurality of elongated metallic members, the applied conductive material being different from the member material;

(c) threading each aligned series of apertures with one of the coated elongated metallic members;

(d) forming an insulating matrix about and between the elongated members to form an assembly;

(e) separating the assembly into planar-like sections, the sections being formed by separating the assembly in a plane substantially perpendicular to the longitudinal axis of each of the elongated members;

(f) and thereafter exposing the separated planar-like sections to the action of an etchant in which the coating material is substantially insoluble for selectively etching away the portions of the metallic members contained in each section.

4. A method for forming an electrically insulating support member of the type utilized in the fabrication of printed circuits, which method includes the steps of:

(a) forming a plurality of holding members each having a predetermined pattern of apertures formed therein;

(b) arranging the holding members in registered relation for forming a plurality of aligned series of apertures, each series including one aperture from each holding member;

(c) threading each aligned series of apertures with an elongated member which member has at least the external circumferential surface thereof formed from a metallic material;

(d) casting a hardenable resin about and between the elongated members;

(e) and after the resin has substantially hardened whereby a unitary assembly is formed, separating the assembly into sections, the sections being formed by separating the assembly in a plane substantially perpendicular to the longitudinal axis of each of the elongated members;

(f) and thereafter exposing the separated sections to the action of an etchant for etching away the metallic material portion of the elongated members contained in each section for forming a plurality of apertures in the resinous portion of each section.

5. A method for forming a multiapertured electrically insulating support member of the type utilized in the fabrication of printed circuits wherein the apertures are provided with relatively thin, electrically conductive, metallic linings, which method includes the steps of:

(a) treating a plurality of elongated, cylindrical, metallic members for effecting a predetermined surface finish upon the circumferential surfaces thereof;

(b) applying a coating of an electrically conductive material upon the individual external circumferential surfaces, the coating material being different from the member material and intimately applied to the surface such that the portion of the coating adjacent the member surface acquires a surface finish substantially similar to that of the members;

(c) arranging the elongated coated members in spaced-apart, fixed relation with respect to one another, the members being disposed with their longitudinal axis in substantially parallel relation;

(d) casting a hardenable resin about and between the members for forming a unitary assembly which includes the hardened resin and the coated members;

(e) dividing the assembly into a plurality of individual sheets, the dividing being accomplished by severing the assembly in a plane substantially perpendicular to the longitudinal axis of the members;

(f) and thereafter exposing the sheets to the action of an etchant in which the coating material and resin are substantially insoluble for selectively etching away only the portions of the members contained in each sheet for providing therein apertures having electrically conductive lining each of the linings having the predetermined surface finish.

6. A method as in claim 5 wherein the coating is applied by electrode position.

7. A method as in claim 5 and further including the steps of:

forming a plurality of holding members each having a predetermined pattern of apertures formed therein;

disposing the holding members in registered relation for forming a plurality of aligned series of apertures, each series including one aperture from each holding member;

and accomplishing the arranging of the members by threading each aligned series of apertures with one of the members.

References Cited

UNITED STATES PATENTS

| | | | |
|---|---|---|---|
| 2,499,977 | 3/1950 | Scott | 29—423 |

FOREIGN PATENTS

| | | |
|---|---|---|
| 700,496 | 12/1953 | Great Britain. |
| 833,958 | 5/1960 | Great Britain. |

OTHER REFERENCES

Mader: Tech. Abstract, June 12, 1951, 647, O.G. 655.

JOHN F. CAMPBELL, *Primary Examiner.*

J. W. BOCK, R. W. CHURCH, *Assistant Examiners.*

UNITED STATES PATENT OFFICE

CERTIFICATE OF CORRECTION

Patent No. 3,325,881 June 20, 1967

James E. Engelking

It is hereby certified that error appears in the above numbered patent requiring correction and that the said Letters Patent should read as corrected below.

Column 1, line 45, for "circiut" read -- circuit --; column 2, line 10, for "as" read -- an --; column 3, line 75, after "relatively" insert -- large --; column 7, line 20, for "lining" read -- linings --.

Signed and sealed this 18th day of June 1968.

(SEAL)
Attest:

Edward M. Fletcher, Jr.
Attesting Officer

EDWARD J. BRENNER
Commissioner of Patents